United States Patent [19]

Wada et al.

[11] Patent Number: 4,606,011

[45] Date of Patent: Aug. 12, 1986

[54] SINGLE TRANSISTOR/CAPACITOR SEMICONDUCTOR MEMORY DEVICE AND METHOD FOR MANUFACTURE

[75] Inventors: Masashi Wada, Yokohama; Shigeyoshi Watanabe, Tokyo; Fujio Masuoka, Yokohama, all of Japan

[73] Assignee: Kabushiki Kaisha Toshiba, Japan

[21] Appl. No.: 791,098

[22] Filed: Oct. 24, 1985

[30] Foreign Application Priority Data

Oct. 31, 1984 [JP] Japan ................. 59-229203

[51] Int. Cl.[4] .......................................... G11C 13/00
[52] U.S. Cl. ................................. 365/149; 357/55
[58] Field of Search ............... 365/149, 150, 174, 182; 357/45, 52, 55

[56] References Cited

U.S. PATENT DOCUMENTS 4,199,722 4/1980 Natori et al. .
4,547,792 10/1985 Sclar .................... 365/149

FOREIGN PATENT DOCUMENTS 58-212161 9/1983 Japan .
59-72161 4/1984 Japan .

OTHER PUBLICATIONS

Wada, et al., "A Folded Capacitor Cell (F.C.C.) for Future Megabit DRAMs," IEDM 244–247 (1984).

Primary Examiner—Terrell W. Fears
Attorney, Agent, or Firm—Finnegan, Henderson, Farabow, Garrett & Dunner

[57] ABSTRACT

A semiconductor memory device and a method for manufacturing such a device provides increased capacitance for memory cells of a dynamic RAM by using the top and sides of island regions formed in the substrate.

5 Claims, 24 Drawing Figures

SINGLE TRANSISTOR/CAPACITOR SEMICONDUCTOR MEMORY DEVICE AND METHOD FOR MANUFACTURE

BACKGROUND OF THE INVENTION

This invention relates to a method for manufacturing a semiconductor memory device having a memory cell structure consisting of one transistor and one capacitor.

A MOS dynamic RAM (hereafter "dRAM") having memory cells formed of one MOS transistor and one MOS capacitor is known in the art. In a dRAM cell, data is stored by the presence or absence of electric charge in a capacitor, and data is read by releasing the electric charge stored in a capacitor through the transistor into a bit line.

In recent years, advances in semiconductor production techniques, particularly in the fine processing technique, has encouraged the growth of dRAM capacity. A chief obstacle to increasing dRAM capacity further is how to decrease the surface area of a memory cell while increasing or maintaining the capacitance of cell capacitor. This is important since the size of the potential change which results when reading a capacitor's electric charge must not be too low. The minimum amount of electric charge is fixed according to an allowance for operation and an allowance for noise, such as from alpha rays. Since the amount of stored electric charge depends on the capacitance of the cell capacitor and the applied voltage, and since the applied voltage is determined by the power source voltage, one must adjust the capacitance of the cell capacitor to maintain sufficient charge storage.

In the conventional dRAM described above, it becomes necessary to decrease the thickness of the gate insulation film, increase the dielectric constant, or widen the surface area to increase the cell capacitance. Any decrease in the thickness of the insulation film, however, is limited by considerations of reliability. To increase the dielectric constant, a nitride film ($Si_3N_4$) may be used in place of an oxide film ($SiO_2$), for example, but the use of nitride film lacks sufficient reliability.

Therefore, to acquire the necessary capacitance, the surface area of a capacitor must be made sufficiently large. The need for a large surface area, however, is generally at odds with attempts to reduce memory cell surface area and increase dRAM density and capacity.

To maintain a large dRAM cell capacitance without increasing the surface area occupied by that cell, some have proposed forming grooves in the surface of the semiconductor substrate at the MOS capacitor region in order to use the side walls of the grooves as MOS capacitors. K. Itoh, et al. "An Experimental 1Mb dRAM with On-Chip Voltage Limiter," ISSCC Technical Digest 282-83 (1984) shows one such method. Conventional dRAM fabrication uses only the flat surface of the substrate, but the method in the Itoh et al. article requires extremely fine and deep grooves. The small openings of such fine grooves impose severe restrictions.

Two other approaches to the problem of maintaining capacitance while decreasing size are the Corrugated Capacitor Cell (CCC) and the Folded Capacitor Cell (FCC). The CCC increases capacitance by making a trench in the capacitor regions and using the walls and bottoms of the trench as part of the capacitor. This method is described in greater detail in H. Sunami et al., IEEE Electron Device Letters, Vol. EDL-, pp. 90-91 (1983). One disadvantage of this approach is that the capacitance is limited by the opening of the trench. As the area of the opening decreases, the trench must be deepened to maintain the capacitance. Deepening the trench, however, causes leakage problems from punch-through between neighboring trenches.

The FCC is discussed in detail in M. Wada et al., "A Folded Capacitor Cell (F.C.C.) for Future Megabit DRAMs," IEDM, pp. 244-247 (1984) and Japanese Patent Disclosure No. 58-212161 (Sept. 12, 1983). This cell uses a vertical capacitor made along the isolation region. Two disadvantages of this cell are the difficult PEP (Photo Engraving Process) of the gate electrode and the capacitor plate due to the uneven substrate, and the large capacitance of the gate electrode at the side walls of the Si island which reduces the switching speed of the device.

An object of this invention is a method for manufacturing a semiconductor memory device, as well the device, with reduced memory cell surface area, but which has an ample capacitance for the cells' capacitors and enables future growth of memory capacity.

Another object of the present invention is a superior method for manufacturing a semiconductor device which permits safe PEP of the gate electrode and results in a high speed memory device.

Additional objects and advantages of the present invention will be set forth in part in the following description and in part will be obvious from that description, or may be learned by practice of the invention. The objects and advantages of the invention may be realized and obtained by the methods and apparatus particularly pointed out in the appended claims.

SUMMARY OF THE INVENTION

Unlike conventional devices which increase the surface area of the capacitor by forming fine grooves in the memory cell region, the present invention overcomes the problems of the prior art and achieves the objects listed above by using the lateral walls of the boundary between the memory cell region and a field region. This method attains a desired increase in the surface area of the capacitor without adding to the surface area to be occupied by the memory cell.

Specifically, the method of this invention for the manufacture of a semiconductor memory device having memory cells, each having one capacitor and one transistor, comprises the steps of: forming a plurality of island regions surrounded by an insulating layer embedded in field regions of a semiconductor substrate such that the insulating layer has a flat surface in the field regions; forming an etching mask on the substrate continuing across a middle part of each of the island regions in a first direction; etching the insulating layer not covered by the etching mask; forming capacitor electrodes separated by a thin insulating film to cover the exposed lateral walls and upper surfaces of the island region; forming a gate insulating film on the upper surface of the middle part of the island regions after removing the etching mask; and forming gate electrodes for the MOS transistors, the gate electrode continuing across the plurality of island regions in the first direction.

A semiconductor memory according to this invention comprises: a plurality of memory cells formed on a substrate of a first conductivity type, each memory cell including an MOS transistor having a gate and a conduction path and an MOS capacitor coupled to one side of the conduction path; a plurality of word lines each coupled to the gates of the ones of the plurality of MOS transistors in a different row; and a plurality of bit lines each coupled to the other side of the conduction paths of the ones of said MOS transistors in a different column. The MOS capacitor in this invention includes a first electrode of a second conductivity type formed in the substrate and in contact with the one side of the conduction path, the first electrode having at least three sides, a thin insulation film formed on the first electrode to cover the three sides of the first electrode, a second electrode formed on the thin insulation film and opposite each of the at least three sides, and a device protection film formed on the second electrode.

The accompanying drawings, which are incorporated in and constitute part of this specification, illustrate ebodiments of this invention and, together with the following description, explain the principles of the invention.

DESCRIPTION OF THE PREFERRED EMBODIMENTS

Figure 1A:
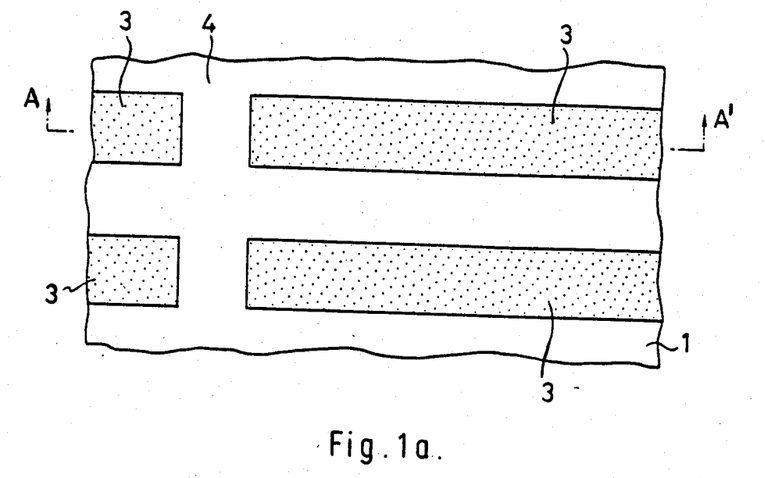
FIGS. 1-7 are diagrams illustrating different steps in the process for manufacturing of a dRAM of this invention, and for FIGS. 1-7 each including parts a, b and c, the subfigure (a) represents a plan view, the subfigure (b) represents a cross-sectional view taken along the line A-A' in the corresponding subfigure (a), and subfigure (c) represents a perspective view.
Figure 1B:
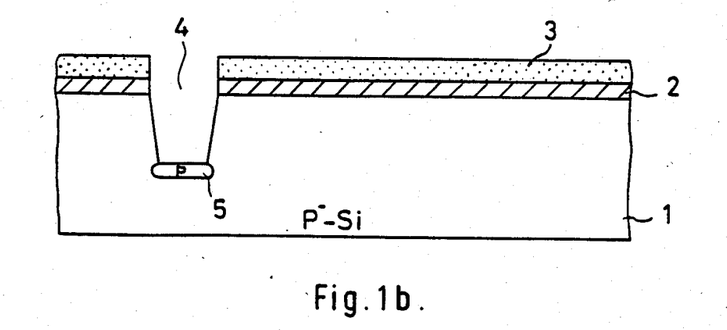
Figure 1C:
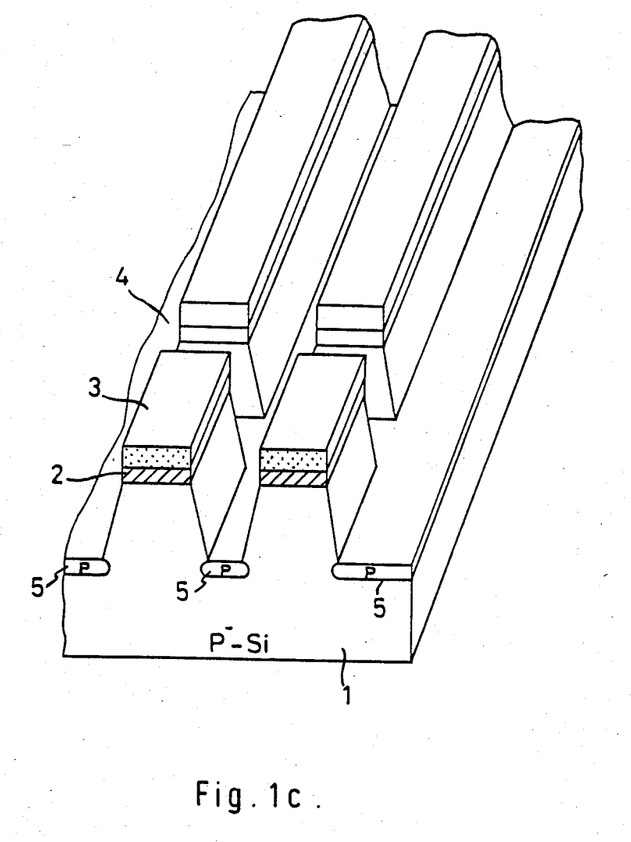
Figure 2A:
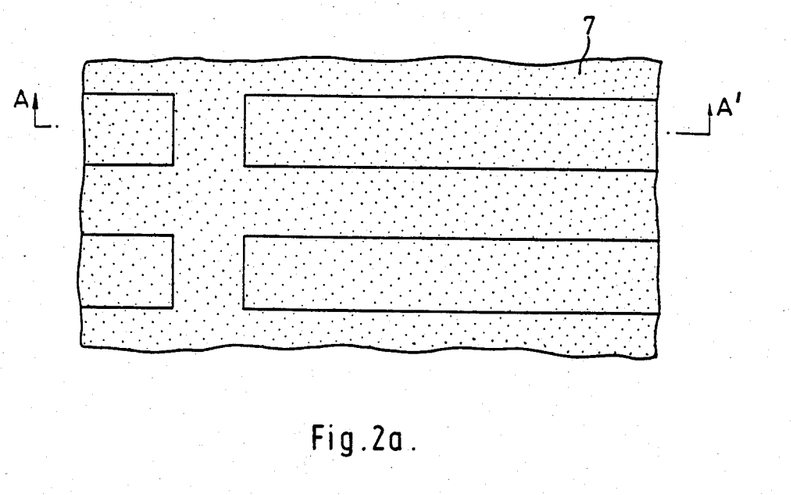
Figure 2B:
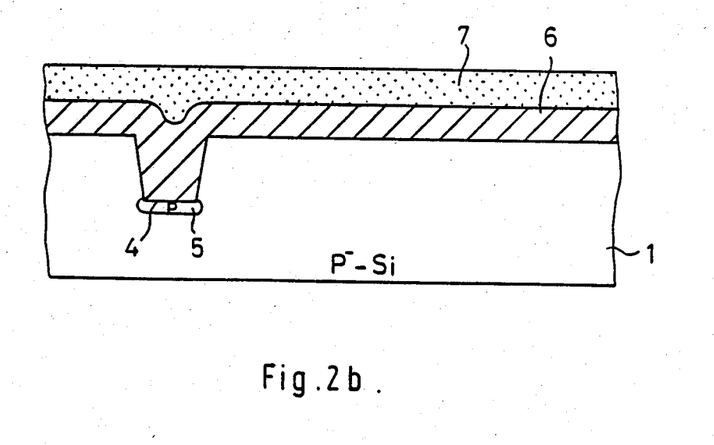
Figure 2C:
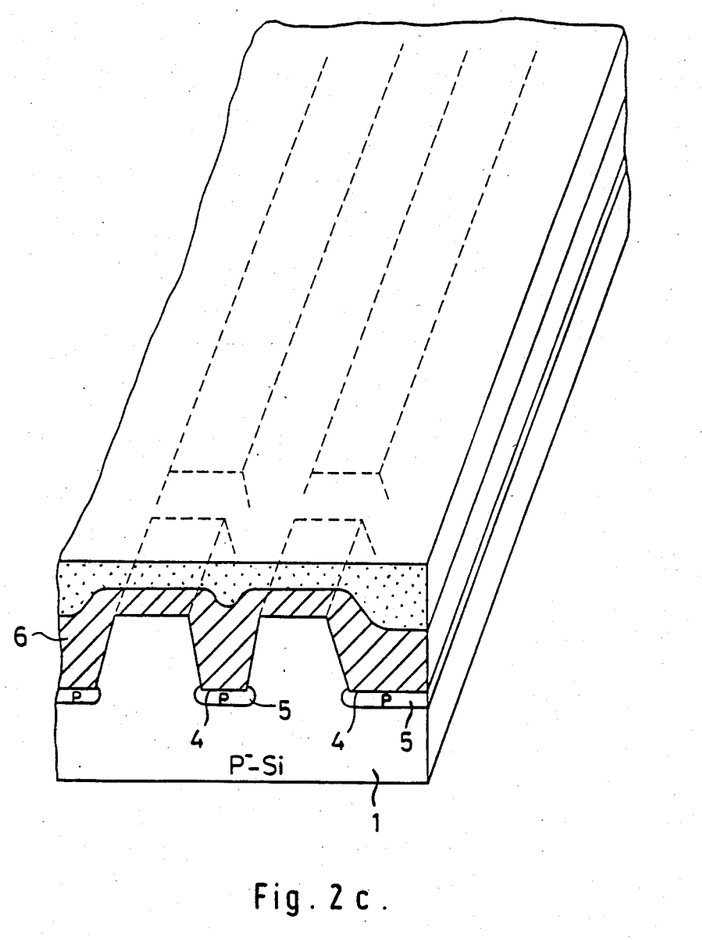

As FIG. 1 shows, an oxide film 2 is formed on a p-type Si substrate 1. A photo-resist 3, intended as an etching mask, is formed in a given pattern on the oxide film 2 by a conventional method. The oxide film 2 is etched, and then a field groove 4 is etched using the reactive ion etching method (RIE). Thereafter, a p-type layer 5 intended for subsequent device separation is formed in the bottom portion of the groove 4 by the ion injection method or the gaseous phase diffusion method. In the embodiment shown in FIGS. 1-7, the memory cell regions have two bits forming one rectangular relief pattern. Next, the photo-resist 3 and the oxide film 2 are removed, and an oxide film (SiO$_2$) 6, intended as a field insulation film, is superposed by the gaseous phase growth method. The result is illustrated in FIG. 2. A photoresist 7 is then applied on oxide film 6 for smoothing the surface.

Figure 3A:
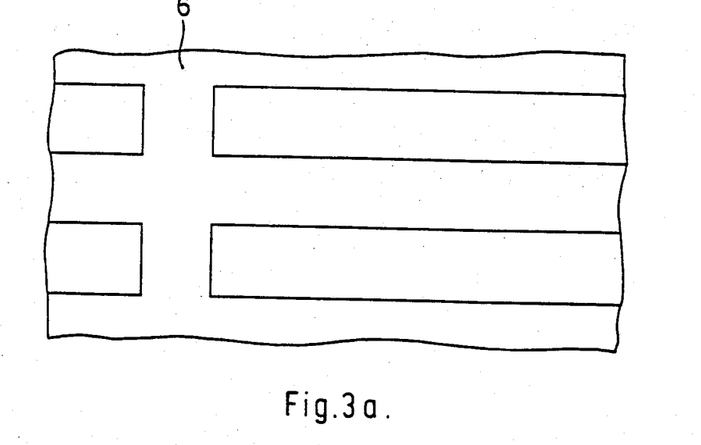
Figure 3B:
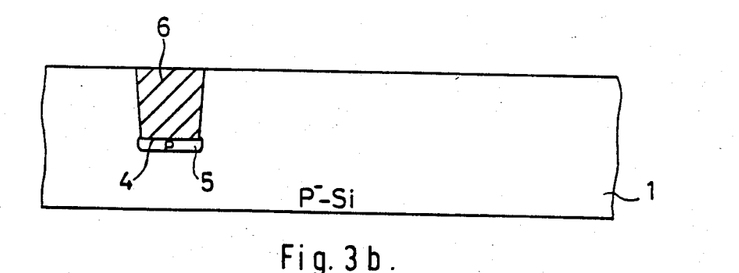
Figure 3C:
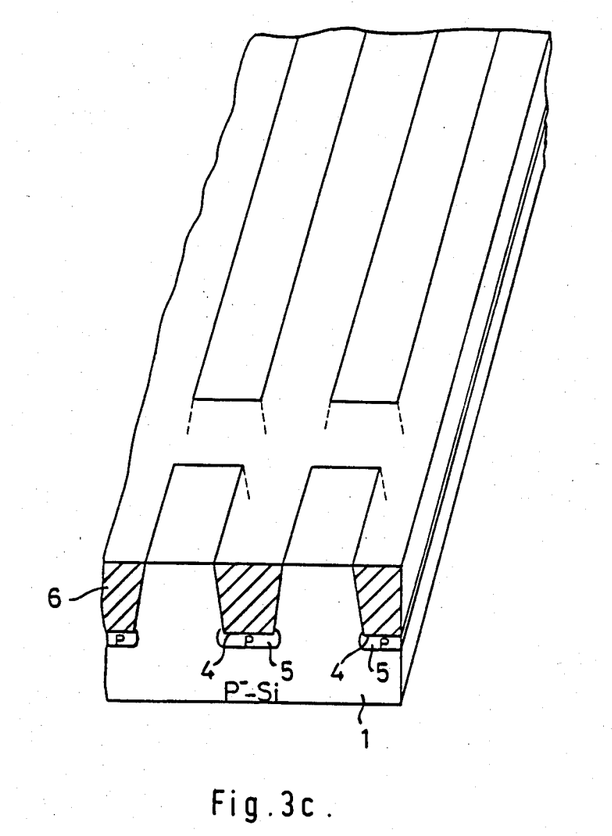

The photo-resist 7 and the oxide film 6 are then etched by the RIE under fixed conditions to effect the etching at substantially equal speeds so that the oxide film 6 is embedded flatly. The result is a substrate having a plurality of island regions as illustrated in FIG. 3 with the oxide film 6 embedded around them to create a flat surface.

Figure 4A:
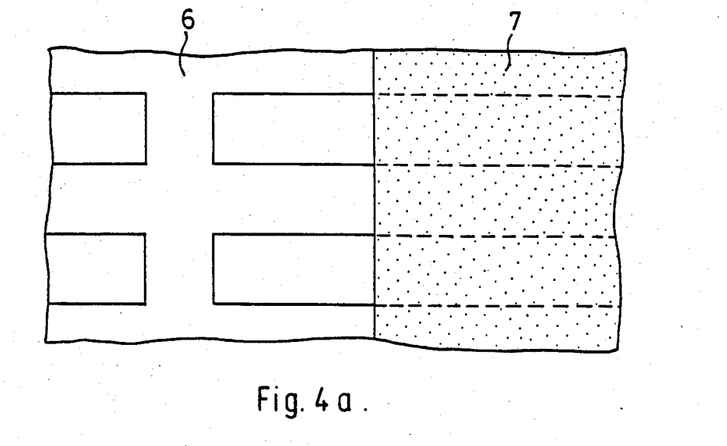
Figure 4B:
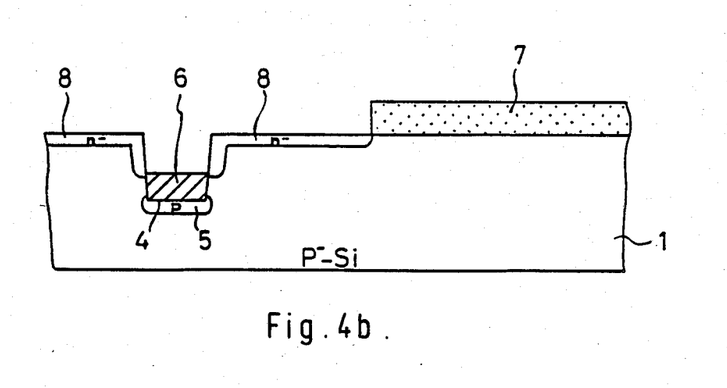
Figure 4C:
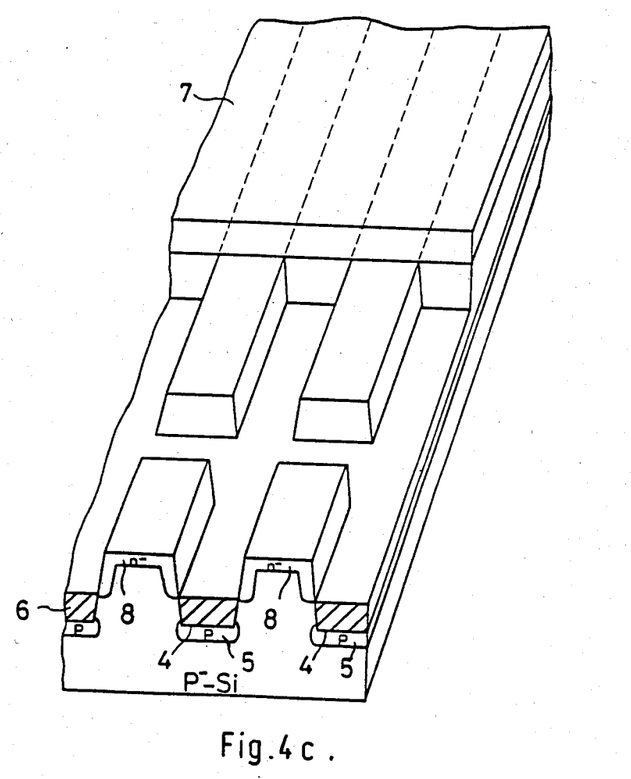

Next, a pattern is imparted to the photo-resist 7 to cover the regions intended to become MOS transistors and the field regions surrounding such transistor regions. This etching mask is formed on the substrate continuing in one direction across the middle part of the plurality of island regions. The oxide film 6 is then etched, and the lateral walls of the regions intended to be MOS capacitors are exposed toward the grooves 4 surrounding the intended capacitor regions. This is shown in FIG. 4 as is the thickness of oxide film 6 which remains for subsequent device separation. This etching may be done until the bottom surface of the groove is exposed, if it is necessary. Then, by ion injecting impurities, an n-type layer 8 intended to form the substrate side electrode of the MOS capacitors is formed. The doping uses photo-resist 7 as a mask. The thicknesses of oxide film 6 persist and are embedded with flat surfaces in the field groove 4 surrounding the region intended for the formation of the MOS transistor.

Figure 5A:
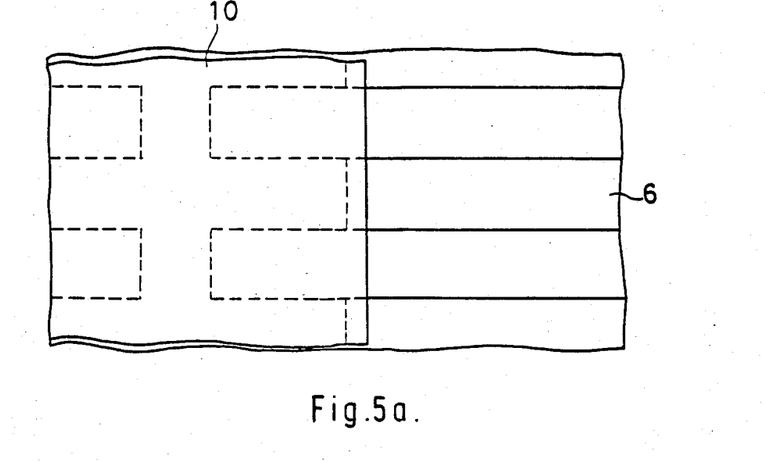
Figure 5B:
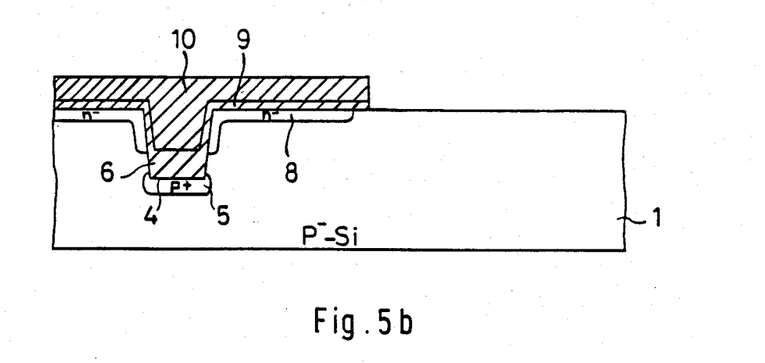
Figure 5C:
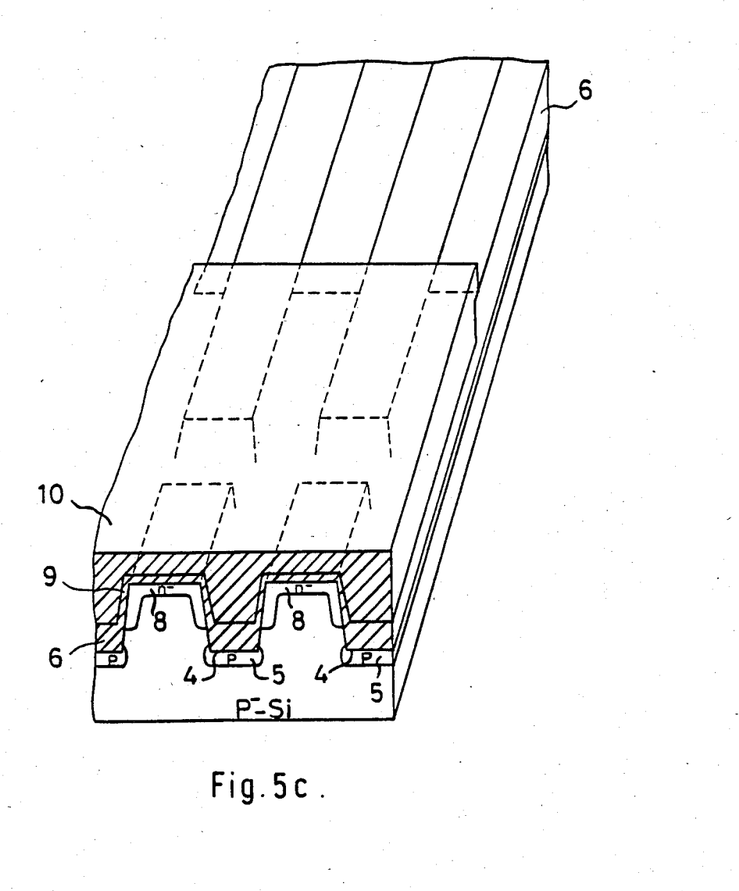

Then, as illustrated in FIG. 5, a thermal oxide film 9, about 100Å thick and intended as an insulation film for the capacitor, is formed. A first layer of polycrystalline silicon film is superposed on top of film 9, and a pattern is imparted to it by photo engraving process. The result is capacitor electrode 10. As noted from FIG. 5 the capacitor electrode 10 is formed not only on the upper surfaces of the island regions but opposite the three lateral walls exposed on the boundary with the field groove 4.

Figure 6A:
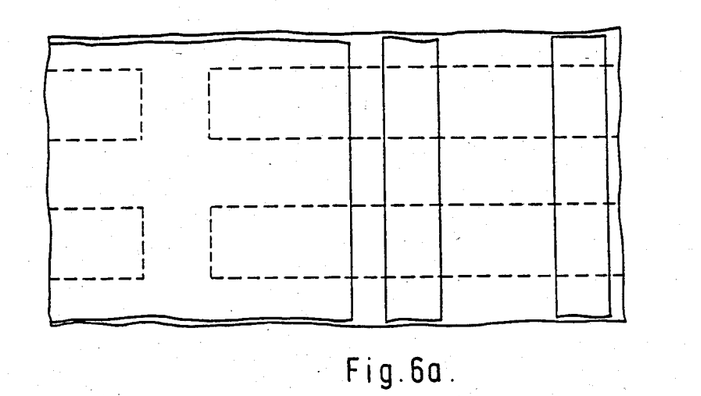
Figure 6B:
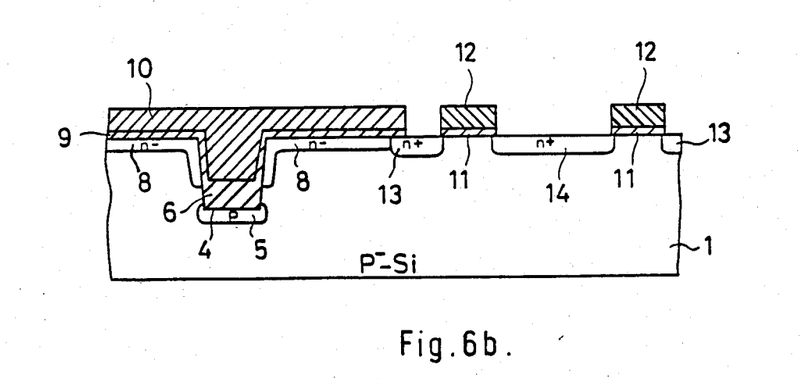

Then gate insulation film 11, a thermal oxide film 100Å in thickness, is formed in the plurality of island regions, and gate electrodes 12 are formed of the second layer of polycrystalline silicon film. As shown in FIG. 6, the gate electrodes 12 are continuously disposed in the longitudinal direction to avoid overlapping the capacitor electrodes 10. So formed, they constitute word lines. Impurities are diffused using the gate electrodes 12 and the capacitor electrodes 10 as the masks to create n+ type layers 13 and 14 intended as source and drain. Finally, as illustrated in FIG. 7, a device protection film 15 of oxide film (SiO$_2$) is formed throughout the entire surface as by the gaseous phase growth method. Wiring contact holes are opened in the protective film and Al lines 16 are distributed in the directions shown for intersect the gate electrodes 12 and for common connection of the drains of the MOS transistor in the memory cells. These latter Al lines serve as bit lines.

The dRAM shown in FIG. 7 utilizes not only the flat surfaces of the memory cell region formed in relief but also the lateral walls of the peripheral field grooves 4 as MOS capacitors. The capacitors therefore enjoy a very large surface area. The perimeter constructed by the walls is largest at the boundary between the cell area and field isolation area.

Figure 6C:
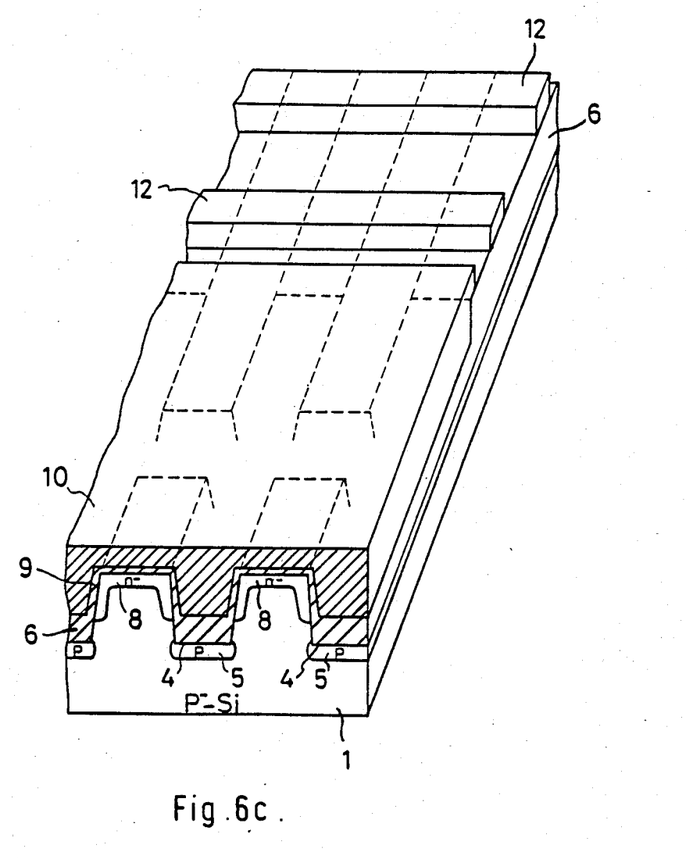
Figure 7A:
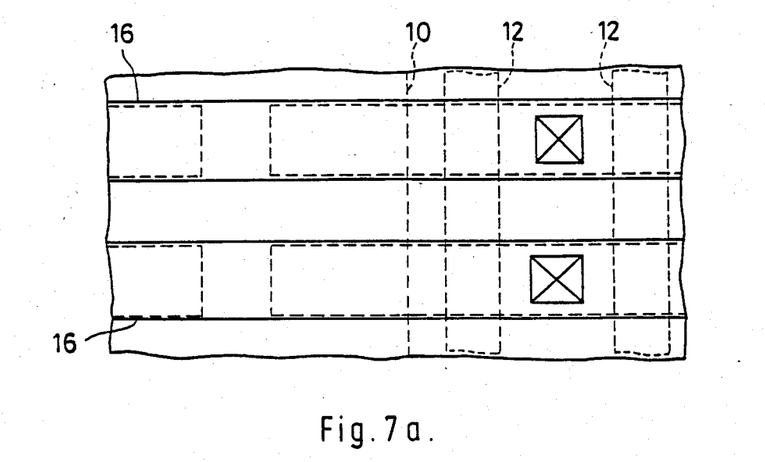
Figure 7B:
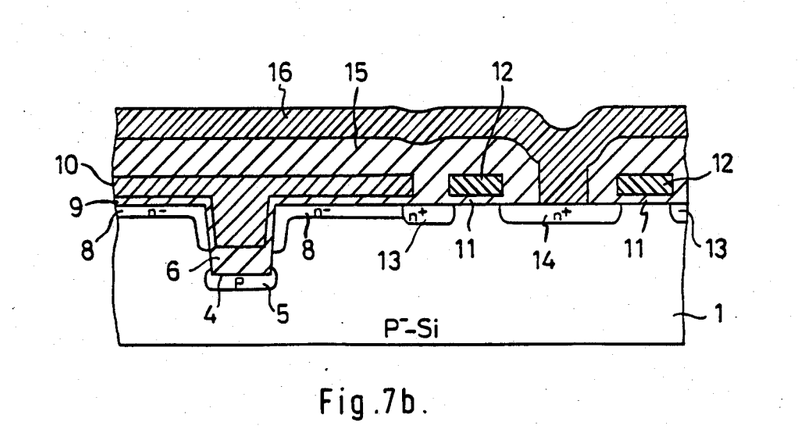
Figure 7C:
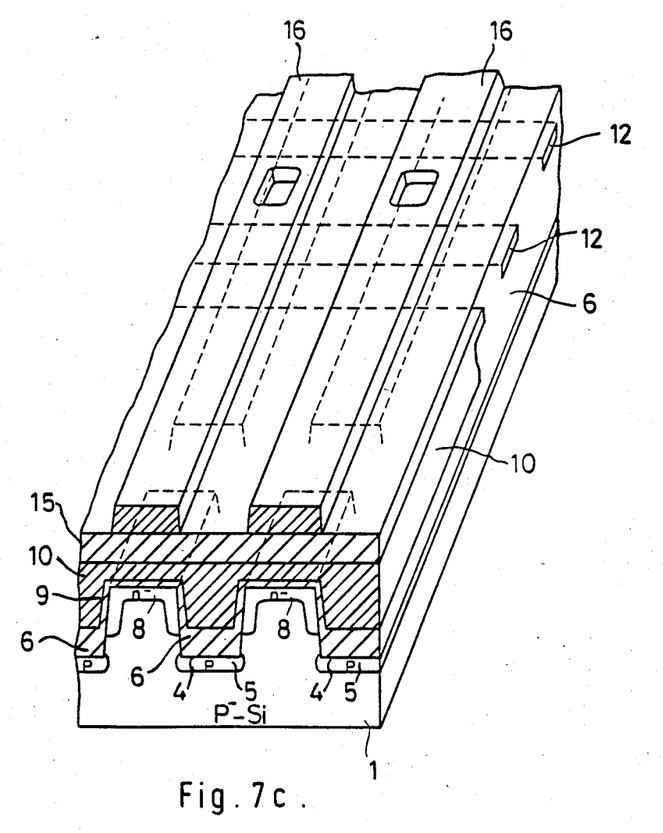

In accordance with this embodiment, as illustrated in FIG. 6(c), a thick oxide film 6 with a flat surface is embedded in the field grooves 4 surrounding the regions intended for formation of gate electrodes 12. The gate electrodes 12 are formed in a prescribed pattern on the flat surfaces free from irregularities. Thus, PEP is effected with high accuracy. Also, the gate electrodes lie perfectly flat on the surface and, unlike the capacitor electrodes, are not allowed to be opposed to the lateral walls of the island regions. The dRAM thus produced does not suffer from useless floating capacitance and enjoys high-speed operation. Furthermore, in this embodiment, the n-type layer 8 is formed by photo-resist 7 as a doping mask. Since photo-resist 7 is also used as an etching mask, the number of masks is minimized.

Figure 8A:
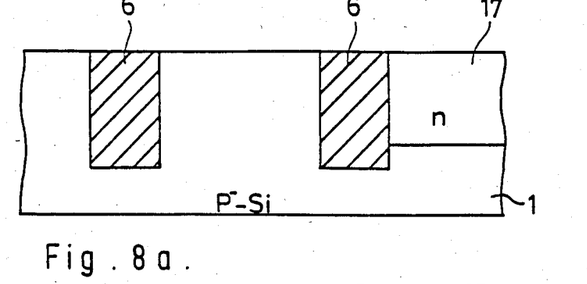
FIGS. 8(a)-(c) represent three perspective views of another embodiment of this invention.
Figure 8B:
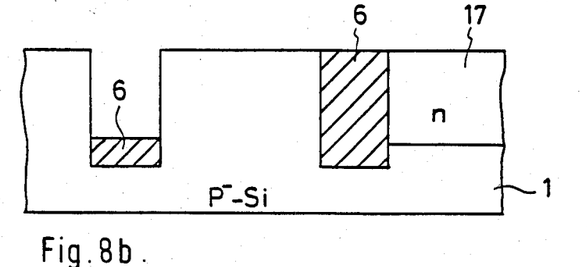
Figure 8C:
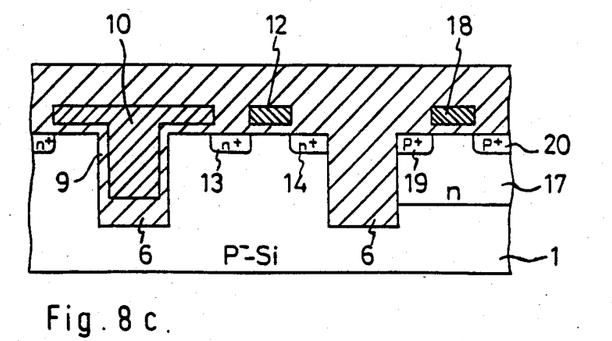

In the foregoing embodiment, the production process has been described only with respect to n channel memory cell regions. FIGS. 8(a)-(c) depict a process according to this invention which takes into account a boundary with the peripheral circuit. In the peripheral circuit shown in FIGS. 8(a)-(c), after a plurality of island regions have been surrounded with an oxide film 6 embedded in the surrounding regions, n-type well 17 is formed in the region intended for p-channel MOS transistor formation.

After this step, which is explained in greater detail in the description of the previous embodiment, oxide film 6, which surrounds the region intended for the formation of the MOS capacitor, is etched to a prescribed thickness. This condition is depicted in FIG. 8(b). In the boundary with the peripheral circuit, the thick oxide film 6 is left intact. This is similar to the process in the preceding embodiment in which the region surrounding the MOS transistor formation region was left intact.

Then, as illustrated in FIG. 8(c), the memory cell is formed in the island regions of the memory cell region, similar to process described in the previous embodiment. In the n-type well 17, gate electrodes 18 are formed as part of the peripheral circuit as are a p-channel MOS transistor incorporating p+ layers 19 and 20 intended as source and drain regions. This production process also achives its object of reduction in memory cell size and increase in memory capacity for a circuit which includes the peripheral circuit.

This invention is not limited to the embodiments described above. For example, the field grooves are formed by etching the Si substrate and the oxide film is embedded in the grooves in the previous embodiment. One method of surrounding the island regions with an insulation film in the surrounding regions uses the following steps. First, a thick insulation layer is selectively formed in a relief pattern in the field region of an Al substrate. This is accomplished by superposing an insulation layer on the entire surface by CVD and then etching the superposed film by RIE. Next, the Si layer is grown on the exposed surface of the Si substrate to substantially the same thickness as the insulation. This method forms a flat substrate equivalent to the substrate in the previous embodiment.

This invention can be embodied with various modifications without departing from the spirit of the invention.

What is claimed is:

1. A semiconductor memory comprising:
   (a) a plurality of memory cells formed on a substrate of a first conductivity type, each said memory cell including
      (i) an MOS transistor having a gate and a conduction path, and
      (ii) an MOS capacitor coupled to one side of said conduction path, said MOS capacitor including
         (aa) a first electrode of a second conductivity type formed in said substrate in contact with said one side of said conduction path, said first electrode having at least three sides,
         (bb) a thin insulation film formed on said first electrode to cover said three sides of said first electrode,
         (cc) a second electrode formed on said thin insulation film and opposite each of said at least three faces, and
         (dd) a device protection film formed on said second electrode;
   (b) a plurality of word lines each coupled to the gates of ones of said plurality of MOS transistors in a different row; and
   (c) a plurality of bit lines each coupled to the other side of the conduction paths of ones of said MOS transistors in a different column.

2. The semiconductor memory of claim 1 wherein said memory cells are formed on island regions of said substrate, each island region having a top and at least two sides and wherein said at least three sides of said electrode include portions of the top and at least two sides of said island regions.

3. The semiconductor memory of claim 2 wherein two memory cells are formed on each island region.

4. The semiconductor memory of claim 2 wherein said island regions are separated by grooves and wherein said memory further comprises a device separation region of said first conductivity type at the bottom of each said groove and a field isolation film filling part of said groove, said field isolation film having a top surface which is substantially flat.

5. The semiconductor memory of claim 1 wherein said thin insulation film includes a thermal oxide film, wherein said device protection film comprises $SiO_2$, and wherein said word lines comprise polycrystalline silicon film.

* * * * *